United States Patent [19]

Sloan

[11] 4,405,934

[45] Sep. 20, 1983

[54] NPM ANTI-SATURATION CLAMP FOR NPN LOGIC GATE TRANSISTOR

[75] Inventor: Benjamin J. Sloan, Garland, Tex.

[73] Assignee: Texas Instruments Incorporated, Dallas, Tex.

[21] Appl. No.: 253,444

[22] Filed: Apr. 13, 1981

[51] Int. Cl.³ .............................................. H01L 29/48
[52] U.S. Cl. ....................................... 357/15; 357/92; 357/86; 357/46
[58] Field of Search .................... 357/92, 15, 86, 46

[56] References Cited

U.S. PATENT DOCUMENTS 3,909,837 9/1975 Kronlage ............................... 357/15
3,943,552 3/1976 Shannon et al. ....................... 357/15

OTHER PUBLICATIONS

Sloan, IEEE Int. Electron Devices Meeting, Technical Digest, Dec. 2, 1979, "STL Technology", pp. 324-327.
Lohstroh, J., IEEE Journal of Solid-State Circuits, vol. SC-14, No. 3, Jun. 1979, "ISL, A Fast and Dense Low-Power Logic, Made in a Standard Schottky Process", pp. 585-590.

Primary Examiner—Martin H. Edlow
Assistant Examiner—Jerome Jackson, Jr.
Attorney, Agent, or Firm—Douglas A. Lashmit; N. Rhys Merrett; Melvin Sharp

[57] ABSTRACT

A bipolar logic gate formed in an isolated N-type epitaxial layer in an integrated circuit device includes a normally operated vertical NPN switch transistor clamped by an inversely operated NPM clamp transistor. The base of the clamp transistor is formed by a high energy boron ion implant into a portion of the N-type epitaxial layer extending through the P-type base of the switch transistor. Multiple outputs are provided by Schottky barrier diodes formed on the N-type epitaxial layer.

4 Claims, 3 Drawing Figures

NPM ANTI-SATURATION CLAMP FOR NPN LOGIC GATE TRANSISTOR

The present invention pertains generally to silicon semiconductor devices and particularly to integrated circuits employing bipolar transistor logic circuitry.

In bipolar integrated circuits, logic circuitry is implemented using a plurality of logic gates which are interconnected to perform a desired logic function. Each logic gate typically comprises a bipolar transistor and multiple inputs to its base or multiple outputs from its collector. Each such transistor provides signal amplification and inversion and will be referred to herein as the switch transistor.

Various techniques have been employed in the prior art to increase the switching speed of the switch transistor. In the logic form known as Schottky transistor logic (STL) a Schottky diode is used to clamp the collector-base junction of an NPN switch transistor so as to prevent saturation of the transistor. Schottky diodes are also used to decouple multiple outputs from the NPN collector. In order to obtain a logic swing, the clamp diode must have a different barrier height than the output diodes. This can be achieved by using platinum to form the clamp diode and titanium to form the output diodes. A disadvantage of STL is the additional processing required to make the Schottky barrier diodes using two different metals.

A more recent logic form known as integrated Schottky logic (ISL) employs a PNP clamp transistor to control the charge saturation of the switch transistor. This logic form is described in an article by Jan Lohstroh entitled "ISL, A Fast and Dense Low Power Logic, Made in a Standard Schottky Process" published in IEEE Journal of Solid State Circuits, Vol. SC 14 pp 585-590, June 1979. The terms of this article are incorporated by reference herein in order to illustrate the state of the art. Although ISL overcomes the problems associated with providing two different types of Schottky barrier diodes, ISL has some distinct disadvantages. In particular, it is regarded as an undesirable feature of ISL that the clamp current is conducted into the substrate, causing the substrate to be active. This necessitates a lower than optimum substrate resistivity and resulting higher collector capacitance, which adversely affects the speed of the device.

Accordingly, it is a principal object of the present invention to provide a bipolar logic form which requires only one type of Schottky barrier diode and enables clamping of the switch transistor without causing the substrate to become active. In accordance with the invention, an NPM (N-P-metal) clamp transistor conducts the base current of an NPN switch transistor to a ground lead once the switch transistor enters saturation.

The presently preferred way of carrying out the invention will now be described by reference to a preferred embodiment described below and illustrated in the accompanying drawing, in which.

Figure 1:
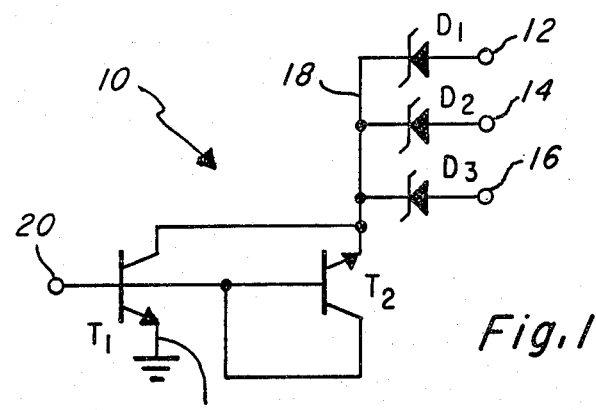
FIG. 1 is an equivalent circuit of a logic gate in accordance with the present invention.

Referring to FIG. 1, an equivalent circuit of one embodiment of a logic gate in accordance with the invention is illustrated and designated generally by reference numeral 10. The logic gate 10 includes an NPN switch transistor $T_1$, an NPM clamp transistor $T_2$, and, in this example, three Schottky barrier diodes $D_1$, $D_2$ and $D_3$. The anodes of the Schottky barrier diodes provide output nodes 12, 14 and 16. The cathodes of the Schottky barrier diodes are connected to a common node 18 which also defines the collector of transistor $T_1$ and the emitter of transistor $T_2$. The transistors $T_1$ and $T_2$ have their bases connected in common with an input node 20. The emitter of transistor $T_1$ is connected to a ground node 22 and the collector of transistor $T_2$ is connected to the input node 20.

The operation of the circuit is as follows. A potential representative of a high logic level is applied at the input node 20 to turn on the switch transistor $T_1$ in order to pull node 18 down to a potential just slightly above ground, thereby holding the output nodes 12, 14 and 16 at a potential representative of a low logic level. The clamp transistor $T_2$ drains off most of the current supplied to node 20 as soon as the emitter-base junction of the clamp transistor $T_2$ becomes forward biased. Although the switch transistor $T_1$ is allowed to go into saturation, because its collector-base junction is forward biased, only a small collector-base current flows in transistor $T_1$ due to the action of the clamp transistor $T_2$. When a low logic level appears at the input node 20, the switch transistor $T_1$ cuts off, thereby isolating node 18 from ground and allowing the output nodes 12, 14 and 16 to be brought up to a high logic level.

Figure 2:
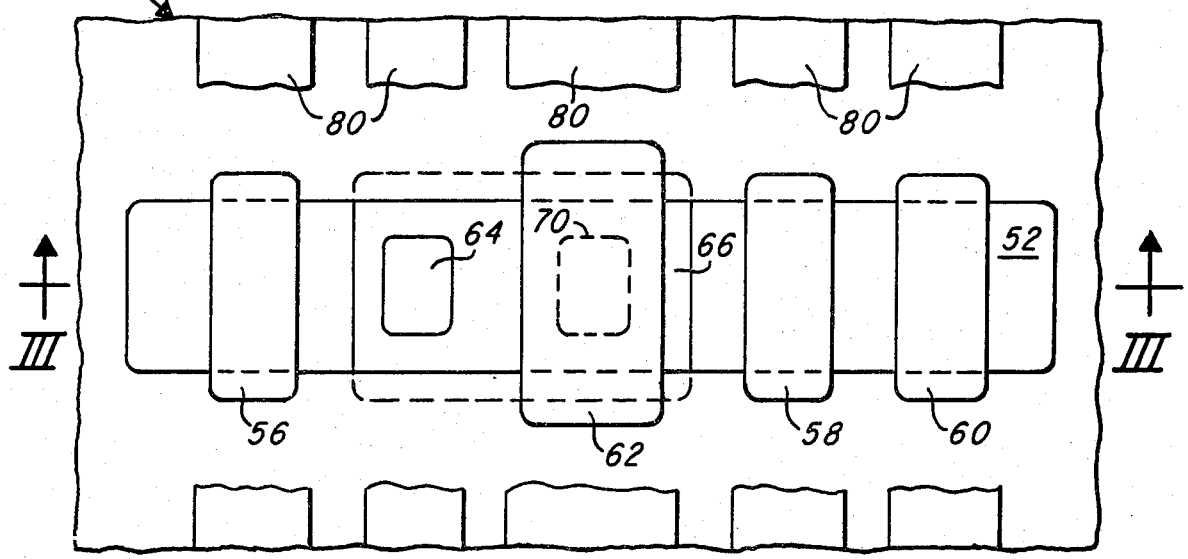
FIG. 2 is a schematic plan view of the inventive logic gate.

Now referring to FIGS. 2 and 3, an implementation of the logic gate 10 of FIG. 1 in a semiconductor integrated circuit device 40 in accordance with the present invention will be described. Only a small portion of the device 40 in which the logic gate 10 is fabricated is illustrated. The device 40 includes upper regions of a body of semiconductor material 42. The body 42 includes a substrate region 44 which preferably comprises P-type monolithic silicon. A relatively low-resistivity N-type region 46, which is referred to in the art as an N+ buried collector, is formed by diffusing a high concentration of donor impurities into an upper portion of the substrate 44. The body also includes a relatively high-resistivity N-type region 48 formed by growing an epitaxial layer on the substrate 44 over the buried collector region 46. The regions 46 and 48 together form node 18 of FIG. 1. A thick field oxide layer 50 is selectively grown down through region 48 around the periphery of region 46 to provide an isolated active area 52 of the semiconductor body 42 within which the logic gate 10 of FIG. 1 is formed. The active area 52, which appears as an elongated rectangular region in FIG. 2, includes an upper surface, designated by reference numeral 54 in FIG. 3, upon which are formed output contacts 56, 58 and 60, an input contact 62, and a ground contact 64, corresponding respectively to the output nodes 12, 14 and 16, the input node 20, and the ground node 22 of FIG. 1.

Figure 3:
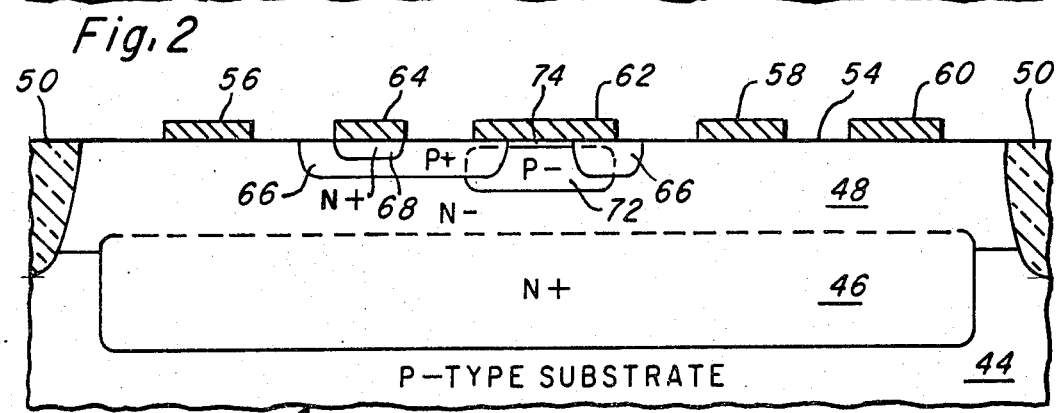
FIG. 3 is a schematic cross-section of the logic gate of FIG. 2 taken along Line III—III in FIG. 2.

With particular reference to FIG. 3, a relatively high-concentration P-type region 66 is formed within a portion of the N-type region 48 under contacts 62 and 64. A high concentration N-type region 68 is formed within region 66 immediately under contact 64. The P-type region 66 is preferably formed in a conventional manner by diffusion or implantation of an acceptor impurity such as boron into an unmasked portion of the epitaxial layer which defines N-type region 48.

In accordance with an important feature of the invention, a surface region within the perimeter of region 66 is masked during formation of region 66 so that a zone of N-type material will extend up through P-type region 66 to the surface following the diffusion step. The boundary of this zone is defined by the dashed outline 70 in FIG. 2. Then, in accordance with the inventive process, a subsurface high-resistivity P-type region 72 is formed by high-energy ion implantation. This is preferably carried out by a boron implant of about $10^{12}$ ions/cm$^2$ and 300–400 KEV into an area slightly larger than the zone 70. The P-type region 72 extends laterally through the zone 70 to separate the underlying N-type region 48 from a high-resistivity surface portion 74. The zone 70, which in its final form includes the N-surface portion 74, the P− implanted region 72 and the underlying portion of the N− region 48, serves to transport the base current over-drive of the gate to the buried N+ region 46 as will be described more fully below.

Relating the structure of the device 40 to the circuit 10, the N-type regions 46 and 48 in combination define the collector of the switch transistor $T_1$ and the emitter of the clamp transistor $T_2$ as well as the cathodes of the output diodes $D_1$, $D_2$ and $D_3$. The P-type region 66 and the N-type region 68 define respectively the base and emitter of the switch transistor $T_1$. The base of the clamp transistor $T_2$ is defined by the P-type emitter region 72 which is preferably implanted in such manner that the high-resistivity surface portion 74 is essentially fully depleted. The contact 62 defines both the Schottky collector of the NPM clamp transistor $T_2$ as well as the ohmic base contact of the NPN switch transistor $T_1$. From the foregoing it will be seen that the logic gate 10 of FIG. 1 is implemented in the portion of the integrated circuit device 40 shown in FIGS. 2 and 3. The logic gate 10 is interconnected with similar logic gates and other circuitry (not shown) by means of upper-level conductors 80 which are shown partially broken away in FIG. 2.

In operation, the clamp transistor $T_2$ remains inactive as long as the switch transistor $T_1$ is in the active region. As the switch transistor enters saturation, its collector-base junction, which is also the emitter-base junction of the clamp transistor, becomes forward-biased. Thus, the clamp transistor becomes active just as the switch transistor begins to saturate, at which time the principal current component is electron current injected into the P− base region 72 of the clamp transistor. It will be appreciated that this has the effect of limiting hole injection into the N− collector region 48 of the switch transistor thereby limiting the associated charge storage delay time. In effect, the base current over-drive of the switch transistor is transported through the clamp transistor to the buried N+ region 46 and then back through the switch transistor to ground.

From the foregoing, it will be apparent that the present invention provides a bipolar logic gate in which the clamp current is conducted to ground and which requires only one type of Schottky barrier diode. Although a preferred embodiment of the invention has been described in detail, it is to be understood that modifications thereof are within the spirit and scope of the invention as defined by the appended claims.

What is claimed is:

1. In an integrated circuit device, the logic gate comprising:
   a P-type semiconductor substrate;
   an epitaxial layer disposed on the substrate and having an upper surface upon which electrical contacts to the logic gate are made;
   means extending from the upper surface to the substrate to define an isolated region of the epitaxial layer within which the logic gate is formed;
   a low-resistivity N-type region disposed in the substrate immediately under the epitaxial layer and substantially laterally coextensive with the isolated region of the epitaxial layer;
   the epitaxial layer having a high-resistivity N-type region adjacent to and overlying the low-resistivity N-type region and extending to the upper surface, a high-concentration P-type region formed within the high resistivity N-type regin and extending to the upper surface, a high concentration N-type region formed within the high-concentration P-type region and extending to the upper surface, a transport zone, and a high resistivity P-type region extending laterally through the transport zone and into the high-concentration P-type region to separate the high-resistivity N-type region of the transport zone into a surface portion and a lower portion; and
   conductors of like metallic material forming first, second and third terminals in contact with the upper surface, the first terminal forming a Schottky barrier contact with the high resistivity N-type region, the second terminal forming an ohmic contact with the high-concentration N-type region, the third terminal forming a Schottky barrier contact with the high-resistivity surface portion of the transport zone and forming an ohmic contact with the high-concentration P-type region, wherein the depth of said high-resistivity P-type region is such that it is not fully depleted in the zero bias condition of said third terminal Schottky barrier contact;
   whereby an NPN switch transistor, an NPM clamp transistor and a Schottky barrier output diode are defined, wherein the high-resistivity N-type region in combination with the low-resistivity N-type region defines the collector of the switch transistor and the emitter of the clamp transistor as well as the cathode of the output diode, the high-concentration P-type region defines the base of the switch transistor, the high-concentration N-type region defines the emitter of the switch transistor, the high-resistivity P-type region defines the base of the clamp transistor, and wherein the portion of the third terminal contacting the high resistivity surface portion of the transport zone defines the collector of the clamp transistor.

2. The logic gate of claim 1 further comprising at least one additional terminal each forming a Schottky barrier contact with the high-resistivity N-type region to define at least a second Schottky barrier output diode.

3. The logic gate of claims 1 or 2 wherein the high-resistivity surface portion of the transport zone comprises an essentially fully depleted N-type region which together with the portion of the third terminal in contact therewith defines the collector of the NPM clamp transistor.

4. The logic gate of claim 3 wherein the high-resistivity P-type region is formed by implantation of acceptor ions at an energy sufficient to convert a subsurface portion of the transport zone to P-type conductivity while allowing the high-resistivity surface portion of the transport zone to remain N-type conductivity.

* * * * *